United States Patent
Cobb

(10) Patent No.: US 6,249,904 B1
(45) Date of Patent: Jun. 19, 2001

(54) METHOD AND APPARATUS FOR SUBMICRON IC DESIGN USING EDGE FRAGMENT TAGGING TO CORRECT EDGE PLACEMENT DISTORTION

(76) Inventor: Nicolas Bailey Cobb, 1632 Willow Lake La., San Jose, CA (US) 95131-3553

( * ) Notice: Subject to any disclaimer, the term of this patent is extended or adjusted under 35 U.S.C. 154(b) by 0 days.

(21) Appl. No.: 09/302,557

(22) Filed: Apr. 30, 1999

(51) Int. Cl.[7] .................................................. G06F 17/50
(52) U.S. Cl. ............................................................. 716/21
(58) Field of Search ........................................ 716/19, 21

(56) References Cited

U.S. PATENT DOCUMENTS

| | | | |
|---|---|---|---|
| 5,242,770 | 9/1993 | Chen et al. | 430/5 |
| 5,447,810 | 9/1995 | Chen et al. | 430/5 |
| 5,553,274 | * 9/1996 | Liebmann | 716/21 |
| 5,740,068 | * 4/1998 | Liebmann et al. | 716/21 |
| 5,815,685 | * 9/1998 | Kamon | 716/21 |
| 5,821,014 | 10/1998 | Chen et al. | 430/5 |
| 5,862,058 | * 1/1999 | Samuels et al. | 716/21 |
| 6,081,658 | * 6/2000 | Rieger et al. | 716/21 |
| 6,189,136 | * 2/2001 | Bothra | 716/21 |

OTHER PUBLICATIONS

Depesa, P., et al., "Automated Critical Dimension and Registration Communication," 11th Annual BACUS Symposium on Photomask Technology, 1991, pp. 26–33, SPIE vol. 1604.

Ohnuma, H., et al., "Fast Chip Level OPC Method on Mask Database," Photomask and X–ray Mask Technology IV, Kawasaki, Japan, Apr. 17–18, 1997, SPIE vol. 3096, pp. 145–153.

Ohnuma, H., et al., "Lithography Computer Aided Design Technoology for Embedded Memory in Logic," Microprocesses and Nanotechnology '98. 1998 International. Microprocesses and Nanotechnology Conference, Kyoungju, South Korea, Jul. 13–16, 1998, vol. 37, No. 12B, pp. 6686–6688.

* cited by examiner

Primary Examiner—Trong Phan
(74) Attorney, Agent, or Firm—Columbia IP Law Group, PC

(57) ABSTRACT

The present invention beneficially provides an improved method and apparatus for designing submicron integrated circuits. A tag identifier is provided to an integrated circuit (IC) design. The tag identifier defines properties for edge fragments in the IC design having edge placement distortion due to the proximity of neighboring features. Edge fragments are tagged if they have the properties defined by the tag identifier. Arbitrary assist features are introduced for each tagged edge fragment. Model-based optical and process correction (OPC) is performed on the tagged edge fragments and the corresponding assist features.

7 Claims, 13 Drawing Sheets

1111 % clearTagScript

1112 % newTag pathFrag -how distance all all .025 \ -edgeBased -from inside -to inside 1113 % newTag path -how loopWithFrag pathFrag 1114 % newTag densePathEdge -how distance path all 0.001 0.4 \ -edgeBased -from outside -to outside 1115 % newTag densePath -how loop WithFrag densePathEdge 1116 % newTag densePathNoEnds -how subtractTag densePath line_end 1117 % newTag isoFragOnDensePath -howdistance densePathNoEnds all>1.0\ -edgeBased -from outside -to outside 1118 % newTag isoDenseFrag -how distance isoFragOnDensePath all>1.0\ -edgeBased -from inside -to outside 1119 % bindModelToTag isoDenseModel isoDenseFrag 1120 % opcTag isoDenseFrag 1121 % newTag pathNotDense -how subtractTag path densePath 1122 % newTag isoPath -how distance pathNotDense all>1.0\ -edgeBased -from outside -to outside 1123 % newTag isoPathEnd -how andTags isoPath line_end 1124 % bindModelToTag hammerHead isoPathEnd

FIG. 11

METHOD AND APPARATUS FOR SUBMICRON IC DESIGN USING EDGE FRAGMENT TAGGING TO CORRECT EDGE PLACEMENT DISTORTION

FIELD OF THE INVENTION

The present invention pertains to the field of integrated circuit (IC) design. More particularly, this invention relates to the art of designing deep submicron ICs.

BACKGROUND OF THE INVENTION

Since the advent of the integrated circuit (IC), circuit components have become smaller and smaller. An IC may include millions of components packed into an incredibly small package. With each new generation of smaller integration, more functionality, and therefore more value, can be derived from ICs. Reliably manufacturing these highly integrated ICs, however, presents significant design challenges.

Those skilled in the art will be familiar with numerous processes for manufacturing ICs. For example, most ICs being with a silicon wafer, and transistors are built one layer at a time in the silicon through repeated applications of photo exposure and chemical processing. A single iteration of the exemplary process usually begins by growing a layer of oxide on the wafer. Then, a layer of light-sensitive material called "photoresist" or "resist" is applied to the oxide. A light source exposes areas of the resist either by projecting an image on the resist material through a reticle or by shining through openings in a contact mask. Hereinafter, the term "mask" will be used to generically refer to a contact mask or a reticle.

A chemical process either etches away the exposed resist material or hardens the exposed resist material and etches away the unexposed material to leave behind a layout. Another chemical process transfers the layout from the resist material to the oxide layer to create barriers of oxide protecting the silicon below. Then, the unprotected silicon can be processed in any number of ways, such as electron diffusion or implantation, to create, for instance, p-type or n-type transistor regions.

The remaining oxide can be stripped away and a new layer grown to begin the next layer. A typical IC may require 16 to 24 iterations of photo exposure and chemical processing to build transistors, contact pads, transmission paths, etc.

Manufacturing challenges tend to arise when critical dimensions (the minimum distance between edges of various types of features in various regions in the IC design) approach, or drop below, the wavelength of the light source used to expose the resist. At critical dimensions near or below the light wavelength, typically in the deep submicron range, manufacturing reliability (yield rate) may be affected by several factors including optical proximity distortions and chemical processing fluctuations. Typical problems include line-end pullback and line-width variations that depend on the local pattern density and topology.

FIG. 1A illustrates a simple example of features that may appear on one layer of an IC design. A mask for the design may allow light to pass through the white areas so that the darkened areas are left unexposed. FIG. 1B, however, shows the resulting design in silicon with a deep submicron critical dimension (CD). In many places, not enough light passed through the mask to adequately expose the resist, causing the features to overlap. In deep submicron ICs, whether or not features overlap at a particular point does not depend solely on the distance between the features. For instance, gap 110A and gap 120A have the same width, CD. In FIG. 1B however, corresponding gap 110B does not overlap, but corresponding gap 120B does overlap. Even though both gaps have the same width in the mask, the proximity of edges near gap 120B alters the edge intensity gradient, reducing the intensity of light reaching the resist and causing variations in the chemical processing. Proximity distortions, such as those illustrated in FIG. 1B, can reduce operating speed, or prevent operation entirely, due to breaks in connectivity and short circuits.

Those skilled in the art will be familiar with the term optical proximity correction, or OPC, which generally refers to modifying integrated circuit (IC) designs to compensate for manufacturing distortions due to the relative proximity of edges in the design. As used herein however, OPC may refer to design modifications based not only on the relative proximity of edges, but also on distortions introduced during chemical processing, such as resist etching and oxide etching. Therefore, OPC, as used herein, refers to optical and process correction, and includes design alterations made to improve manufacturability from exposure through chemical processing.

As IC designs become more complex, manual OPC (entering corrections by hand through trial and error) becomes more time consuming and less cost effective. Software modeling, or simulation, is a basis for one form of automated OPC referred to herein as model-based OPC. In model-based OPC, manufacturing distortions can be predicted and compensated for at the design stage by operating on edge fragments. FIG. 2A illustrates a compensated design based on the design of FIG. 1A.

Model-based OPC can be very computationally intensive. For every edge, or fragment of an edge, an edge placement error is determined by simulation. Based on an edge placement error, an edge fragment may be pushed or pulled in an attempt to compensate for the error. The simulations and adjustments may need to be repeated several times for each edge fragment before the edge placement error is within acceptable limits. FIG. 2B illustrates the design in silicon based on the compensated mask.

Another automated approach is referred to herein as rule-based OPC. According to a rule-based approach, whenever a particular feature is encountered, a predetermined alteration is introduced. For instance, at every convex right angle, a "serif" can be added, which is basically involves pushing the corner edge fragments out a predetermined distance.

Rule-based OPC, however, relies on the presumption that altering a particular feature with a predetermined change will improve the quality of the manufactured design. The presumption does not always hold true. For instance, in FIG. 2A, not all of the convex right angle edge fragments are pushed out, and of those that are pushed out, they are not all pushed the same distance.

FIG. 3A illustrates another type of IC design feature that is often distorted when manufactured with critical dimensions (CD) near or below the light source wavelength. Densely packed edges alter edge intensity gradients so that edge placement is distorted. Feature 310A extends from a densely packed region to an isolated region. FIG. 3B illustrates what may result. Line width variations, such as the variation over the length of feature 310B, can cause significant problems.

As discussed in U.S. Pat. No. 5,242,770 issued to Chen et al., line width variations can be reduced by employing assist features called leveling bars. FIG. 4 illustrates a set of leveling bars 410. The width W of the leveling bars is too narrow for the features to be reproduced in the resist. According to the '770 patent, however, leveling bars spaced at a predetermined distance D on either side of the distorted feature should reduce edge placement distortion. In which case, leveling bars can be automatically placed at a predetermined distance D on either side of features such as feature 310A using a rule-based approach.

Model-based OPC, although usually much slower than rule-based OPC, is much more accurate and produces superior yield rates. Rule-based OPC can be faster than model-based OPC because rule-based OPC is less computationally intensive. In which case, using rule-based or model-based OPC is a tradeoff between speed and accuracy.

Thus, it would be desirable if rule-based and model-based OPC could be selectively employed at a feature level in an efficient manner.

SUMMARY OF THE INVENTION

The present invention beneficially provides an improved method and apparatus for designing submicron integrated circuits. A tag identifier is provided to an integrated circuit (IC) design. The tag identifier defines properties for edge fragments in the IC design having edge placement distortion due to the proximity of neighboring features. Edge fragments are tagged if they have the properties defined by the tag identifier. Arbitrary assist features are introduced for each tagged edge fragment. Model-based optical and process correction (OPC) is performed on the tagged edge fragments and on the corresponding assist features.

BRIEF DESCRIPTION OF THE DRAWINGS

Examples of the present invention are illustrated in the accompanying drawings. The accompanying drawings, however, do not limit the scope of the present invention. Like references in the drawings indicate similar elements.

FIG. 11 illustrates one embodiment of a tagging script.

DETAILED DESCRIPTION

Figure 1B:
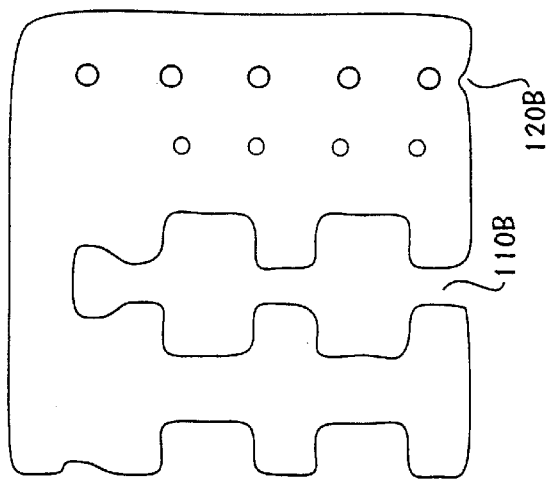
FIGS. 1A and 1B illustrate an uncompensated IC design.
Figure 2B:
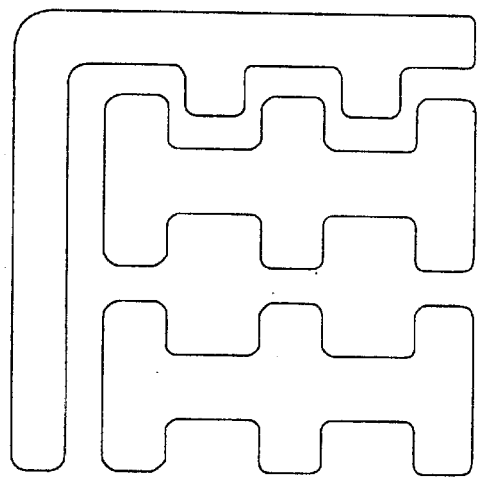
FIGS. 2A and 2B illustrate a compensated IC design.
Figure 1A:
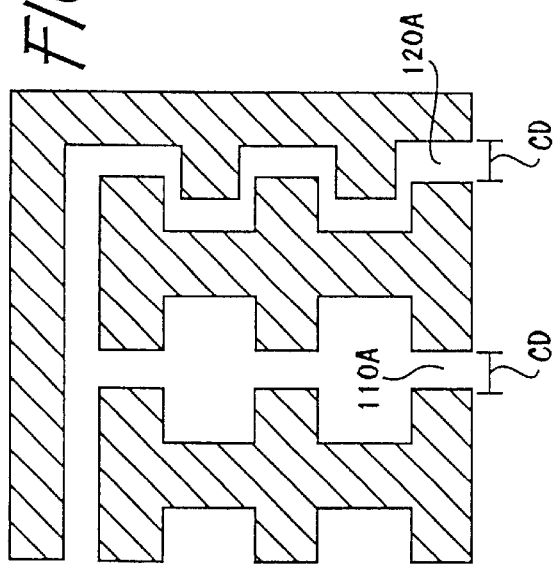
Figure 2A:
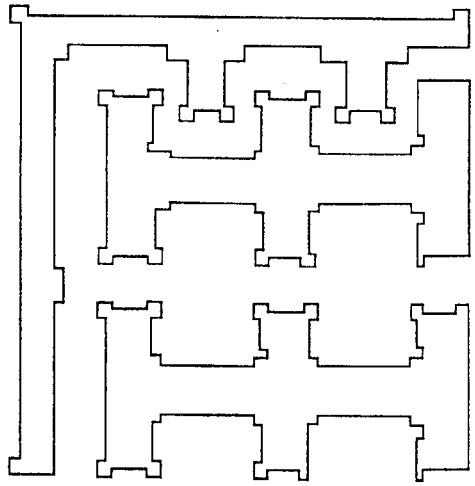
Figure 3A:
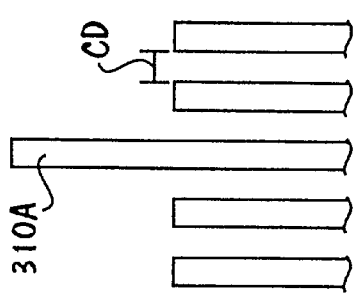
FIGS. 3A and 3B illustrate line width variation due to isolated and densely packed edges.
Figure 3B:
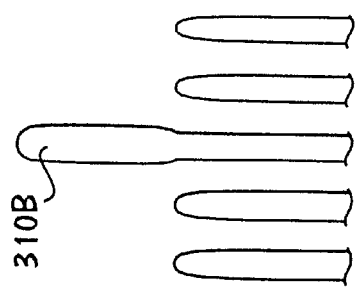
Figure 4:
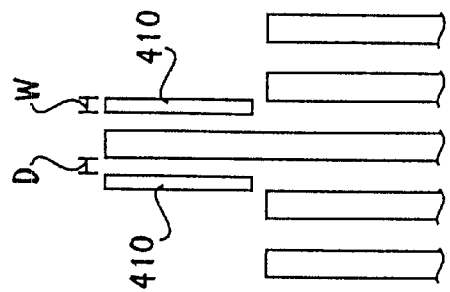
FIG. 4 illustrates assist features to reduce line width variation.

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

Various operations will be described as multiple discrete steps performed in turn in a manner that is helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

The present invention provides an improved method and apparatus for designing integrated circuit (IC) layouts. Layouts are composed of polygons of edge fragments. Edge fragments that have certain properties can be identified and tagged. For instance, any edge fragments that are of particular interest or concern, such edge fragments that form line ends or edge fragments that form convex corners, can be tagged. Then, in some embodiments, the tagged edge fragments can be controlled in various ways. For instance, a user can apply different types of optical and process correction (OPC) to the tagged edge fragments, or view which edges in an IC layout have received certain tags. The tags can also be saved so that other tools can use them.

The present invention can be used to achieve certain performance advantages over ordinary model-based or rule-based OPC. Model-based OPC provides a high level of accuracy and contributes to superior yield rates, but tends to be slow. Rule-based OPC, on the other hand, can be fast, but is often inaccurate. The present invention may achieve performance advantages, for instance, by selectively applying OPC to only tagged edge fragments, resulting in a potentially significant time savings. Depending on the kinds edge fragments that are tagged and the type of OPC applied to each edge fragment, there may also be little or no degradation in accuracy compared to ordinary model-based OPC. In other embodiments, speed and accuracy may be improved by utilizing customized or optimized models for particular types of tagged edge fragments, such as a hammerhead model for line-end edge fragments or assist-feature models for dense-to-isolated edges. In still other embodiments, combined rule-based and model-based approaches can also be used. For instance, a rule-based approach can be tried first, and a model-based approach used only if necessary. Additional advantages and applications of the present invention will be understood from the descriptions and examples of particular embodiments to follow.

Figure 5:
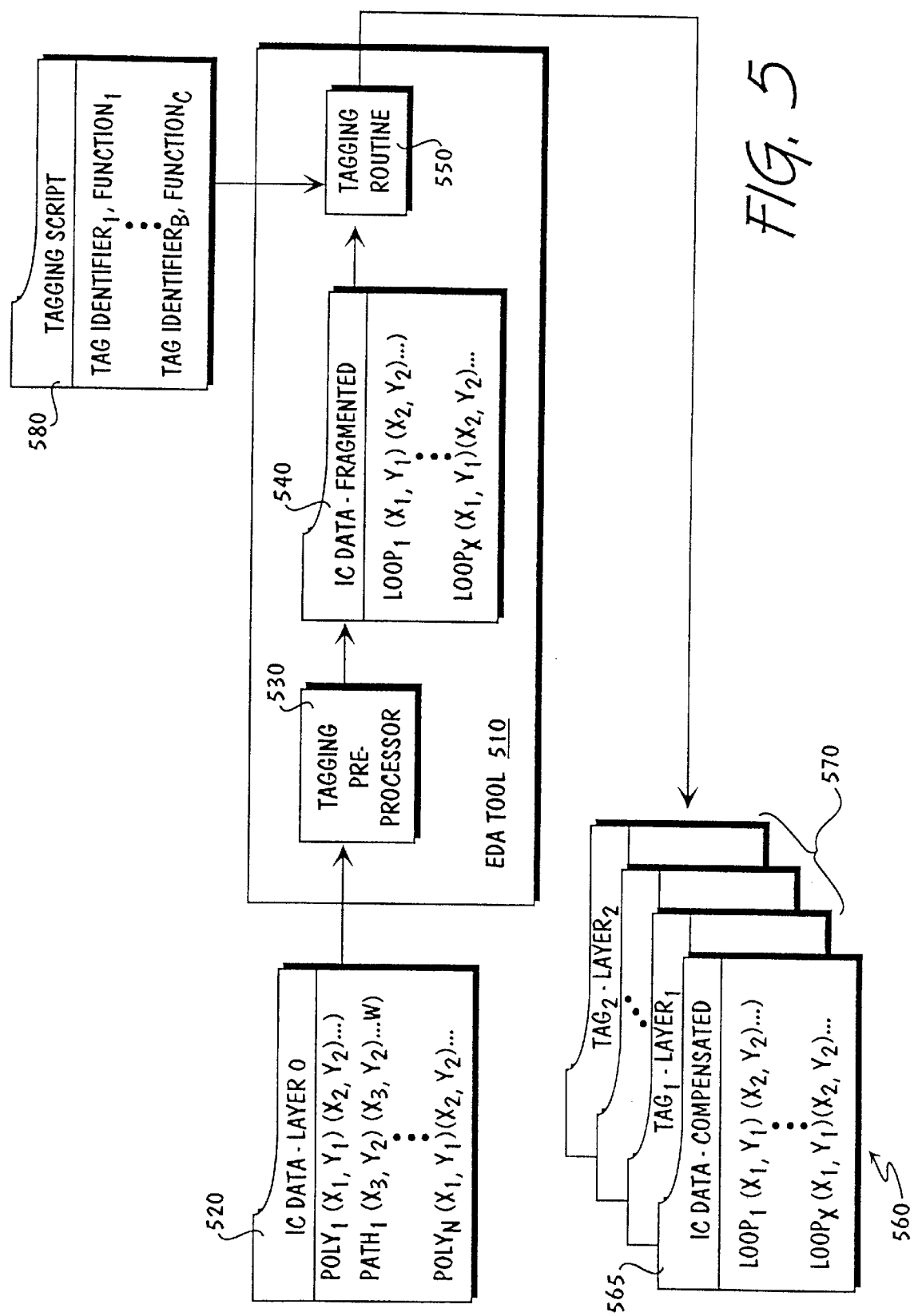
FIG. 5 illustrates an environment for one embodiment of the present invention.

FIG. 5 illustrates an environment for one embodiment of the present invention. Electronic design automation (EDA)

tool 510 includes a tagging preprocessor 530 and a tagging routine 550. Tagging preprocessor 530, as discussed below, homogenizes and fragments IC data in preparation for tagging. Also as discussed below, tagging routine 550 performs one or more tagging scripts 580 on the fragmented IC data.

Figure 6:
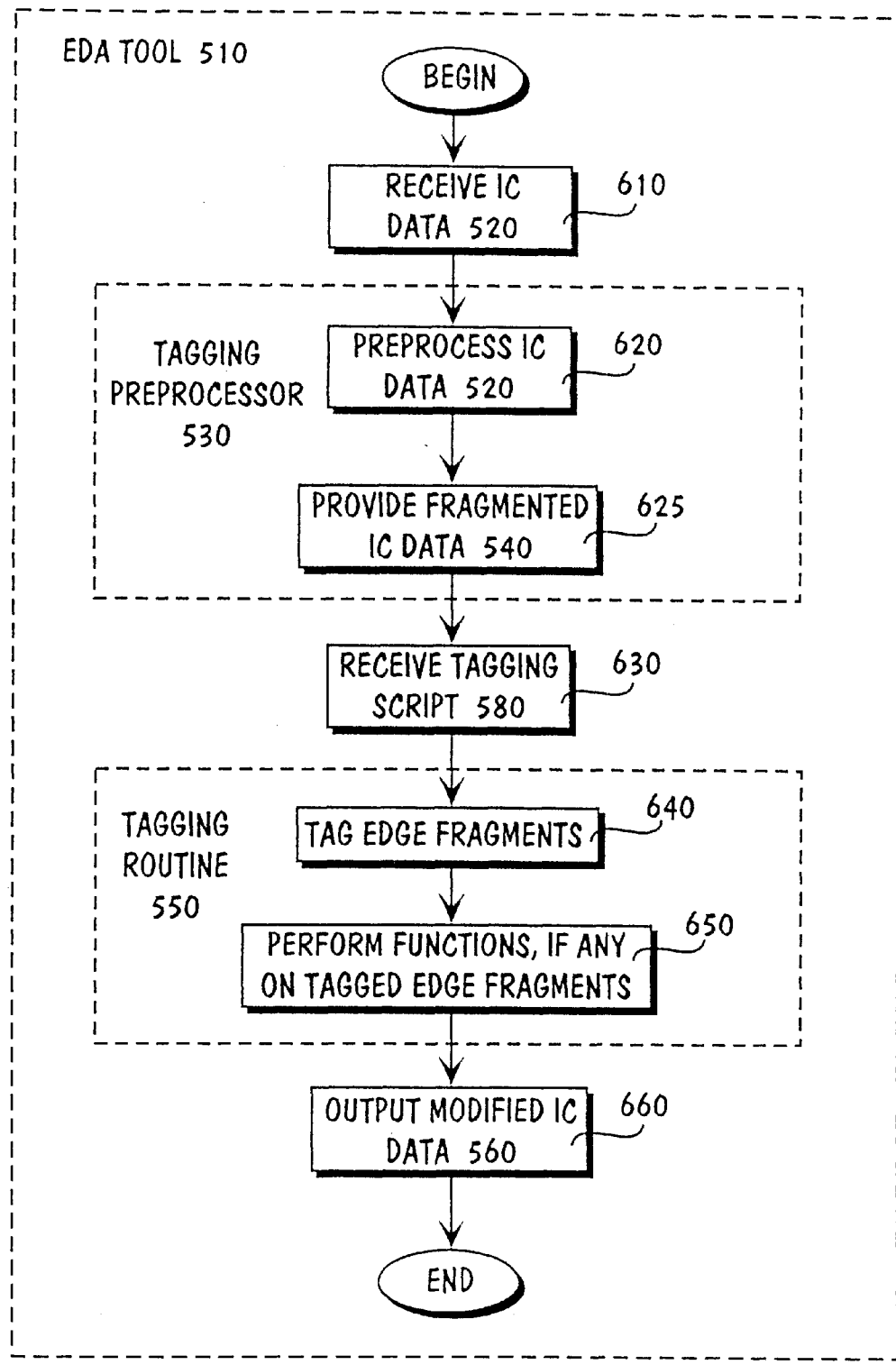
FIG. 6 illustrates a tagging process of one embodiment of the present invention.

FIG. 6 illustrates the general flow of one embodiment of a process performed by EDA tool 510 of FIG. 5. In 610, EDA tool 510 receives IC data 520. IC data 520 may be in any of a number of formats, including GDSII (Graphic Design System II) format. As illustrated in FIG. 5, IC data 520 includes polygons, such as POLY1. Each polygon is defined by a set of two-dimensional vertices. A line segment is implied between each pair of vertices to form a closed polygon. IC data 520 also includes various shorthand notations for polygons, such as PATH1. Each path is defined by a set of two-dimensional vertices and a width, W. A polygon of width W is implied along a line segment between each pair of vertices. Other shorthand notations may include circles defined, for instance, by a center point and a radius, cross-hatched regions defined, for instance, by line width and orientation, etc.

Figure 7:
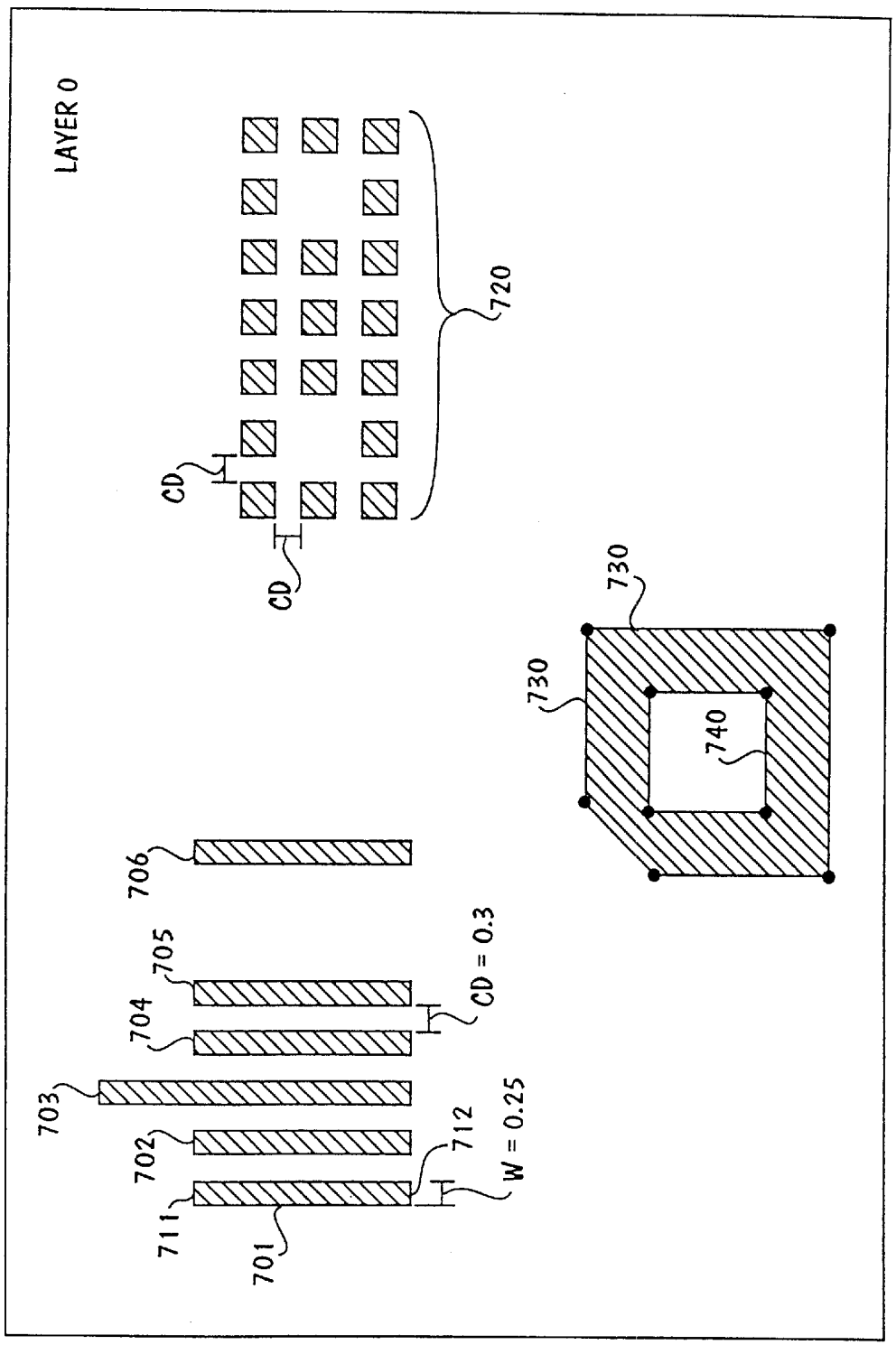
FIG. 7 illustrates a number of features in one embodiment of an IC design.

Skipping now to FIG. 7, a number of features that may be included in IC design data 520 are illustrated. In the illustrated embodiment, IC data 520 defines a single layer of features, LAYER 0. Those skilled in the art will recognized that, in alternate embodiments, IC data may include multiple layers. Shorthand notations may be used to define paths 701 to 706 and/or contact pads 720.

Returning to FIG. 6, in 620, tagging preprocessor 530 preprocesses IC data 520 and generates fragmented IC data 540. Any number of techniques can be used for preprocessing. Basically, preprocessing involves two steps. First, data is homogenized by converting all features into closed polygons, or loops. That is, all shorthand notations are replaced with polygon notations. For instance, a path is converted from a string of vertices, with a width W, to a set of vertices defining a long, narrow polygon outlining of the path.

The second preprocessing step is fragmenting. Fragmenting involves inserting additional vertices to create smaller sections of edges, or edge fragments. Employment rules generally define where vertices should be added. For instance, vertices are usually added so that there is no more than a maximum edge fragment length between vertices. Vertices may also be added near particular types of vertices, such as adding vertices near corner vertices so that a corner is comprised of two short edge fragments.

If more vertices are added, more precise edge placement corrections can be made, but more OPC computations must be performed. That is, increasing the granularity of edge fragments increases potential OPC accuracy but decreases speed. Densely filled areas are likely to need more intricate edge placement correction than sparsely filled areas, so more vertices may be added to densely filled areas than to sparsely filled areas.

Figure 8:
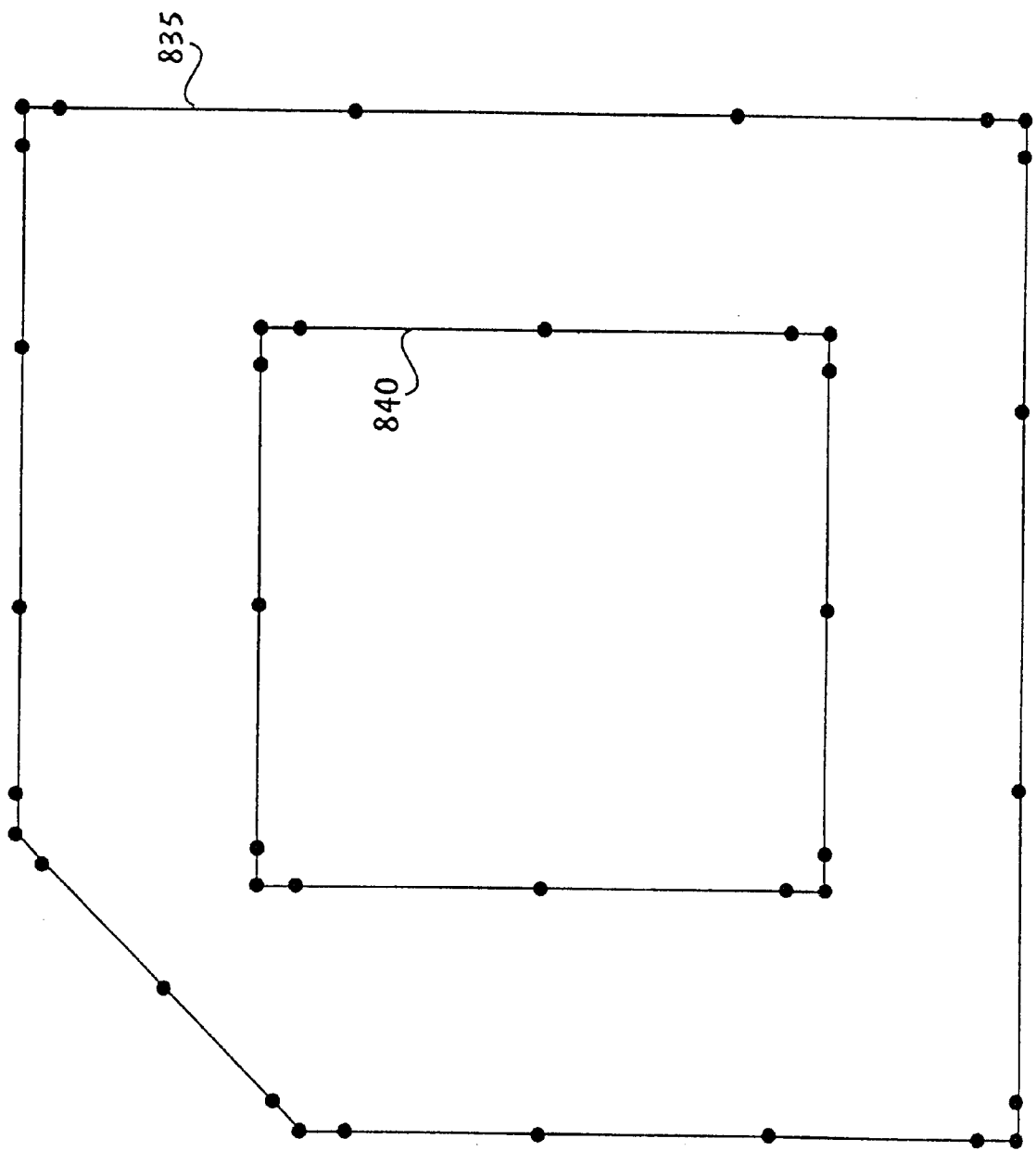
FIG. 8 illustrates one embodiment of a fragmented feature.

Skipping now to FIG. 8, a fragmented feature is illustrated. In the illustrated embodiment, vertices are added at a particular distance to either side of corner vertices. Vertices are also added at intervals along the edges so that no edge fragment is longer than a maximum edge fragment length. Loop 835 can be called a positive loop because it defines the perimeter of a feature, and loop 840 can be called a negative loop because it defines an opening in a feature.

Returning again to FIG. 6, the general flow further includes receiving tagging script 580 in 630, tagging edge fragments according to tagging script 580 in 640, performing functions, if any, on tagged edge fragments according to tagging script 580 in 650, and outputting modified IC data 560 in 660. One embodiment of tagging 640 and performing functions 650, as performed by tagging routine 550, is discussed below in more detail with respect to FIG. 9. Modified IC data 560 can take many forms and be used for many purposes. In the illustrated embodiment, and as discussed below, modified IC data 560 includes OPC-compensated IC data 565 and a number of additional layers of persistent tags 570.

Figure 9:
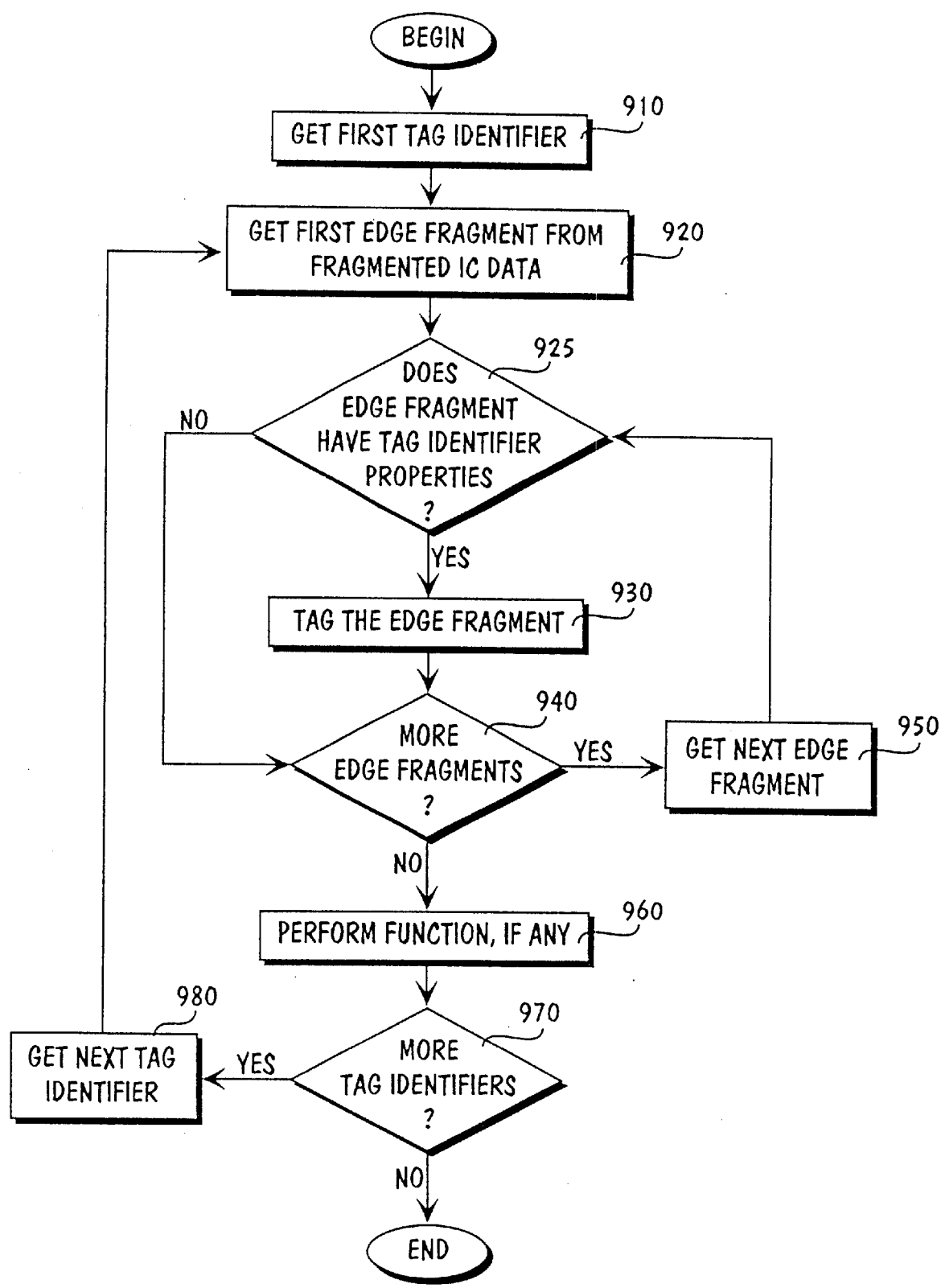
FIG. 9 illustrates one embodiment of a process to perform a tagging script.

FIG. 9 illustrates one embodiment of 640 and 650 of FIG. 6 in more detail. In 910, tagging routine 550 retrieves a first tag identifier from tagging script 580. A tag identifier defines a set of properties for an edge fragment. For instance, there may be tag identifiers for vertical edge fragments, horizontal edge fragments, edge fragments with a particular length, all edge fragments, all edge fragments on a particular layer, and edge fragments at a particular angle. Tag identifiers may also define edge fragments based on relationships with surrounding edge fragments. For instance, there may be tag identifiers for edge fragments that form convex corners, concave corners, or line ends, edge fragments adjacent to corner or line-end edge fragments, edge fragments that form particular angles with other edge fragments, edge fragments in a user-defined sequence of edge fragment lengths, corner angles, and/or spacings, edge fragments comprising a positive or negative loop that includes one or more edge fragments of a particular type, and edge fragments comprising positive or negative loops having a particular area. Tag identifiers may also define edge fragments that have particular edge placement errors. Virtually any property can be a tag identifier. In which case, tag identifiers can be created to define virtually any type of edge fragment that is of particular interest or concern.

In 920, an edge fragment is retrieved from the fragmented IC data, and, in 925, the edge fragment is compared to the properties defined by the tag identifier. If the edge fragment has the properties defined by the tag identifier, the edge fragment is tagged in 930 accordingly. In one embodiment, a tagged edge fragment can be thought of as an edge fragment that has been labeled according to the tag identifier. For instance, each edge fragment that is tagged using a corner tag identifier is essentially labeled as a corner edge fragment.

In 940, tagging routing 550 checks to see if there are any more edge fragments to compare to the tag identifier. If there are more edge fragments, the next edge fragment is retrieved in 950 and the process loops back to 925. If there are no more edge fragments in the fragmented IC data to compare to the tag identifier, then, in 960, tagging routine 550 performs functions, if any, on the tagged edges as defined by the tagging script.

Functions may include performing rule-based OPC or model-based OPC, or a combination of both, on the set of tagged edge fragments. Other functions include combining the set of tagged edge fragments with another set of previously tagged edge fragments to define new sets of tagged edge fragments. For instance, a set of edge fragments tagged with a convex-corner tag identifier may be added to a set of edge fragments tagged with an adjacent-to-convex-corner tag identifier. In another example, horizontal edge fragments could be removed from a set of all edge fragments to create a new set of non-horizontal edge fragments.

Alternately, no functions may be performed on tagged edge fragments in 960. That is, edge fragments may simply be tagged for future use, whatever use that may be.

In 970 of FIG. 9, if there are more tag identifiers in the tagging script, the next tag identifier is retrieved in 980 and the process loops back to 920. An edge fragment may be tagged according to multiple tag identifiers. For instance, an edge fragment may be tagged as being part of a line-end as well as being horizontal. If there are no more tag identifiers, the process ends.

In an alternate embodiment, the process of FIG. 9 operates on one window of an IC layout at a time. That is, rather than applying a tag identifier to every edge fragment in the fragmented IC data before moving on to the next tag identifier, the IC data is divided into windows or grid sections. All of the tag identifiers are applied to all of the edge fragments within a window before moving on to the next window.

Any number of additional approaches could be used to apply tag identifiers to edge fragments. For instance, the process could start by selecting an edge fragment and applying all tag identifiers to the edge fragment before moving on to the next edge fragment.

Figure 10:
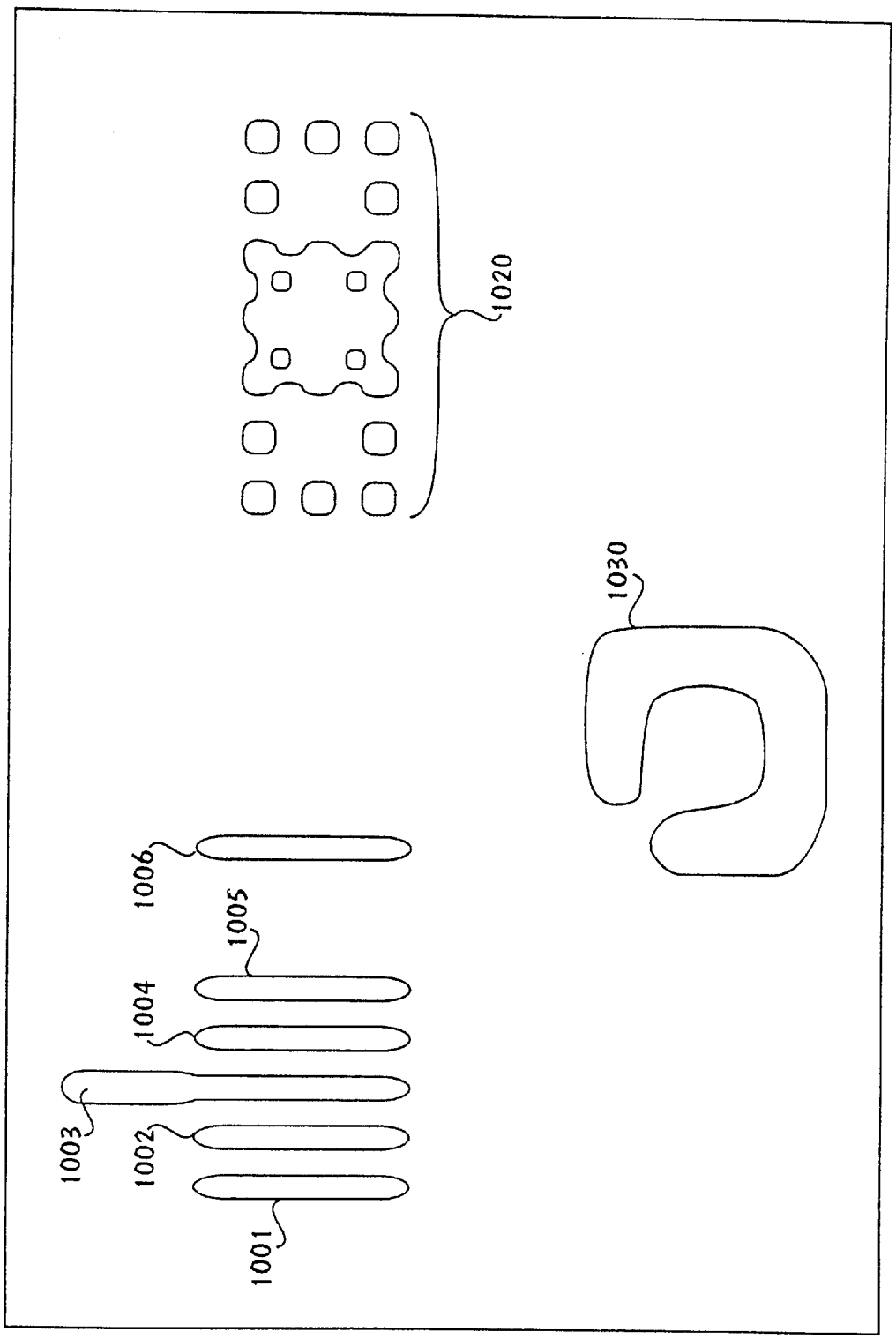
FIG. 10 illustrates one embodiment of uncompensated features in silicon.

An example of the present invention is presented with reference to FIGS. 7 and 10–12. As discussed above, FIG. 7 illustrates a number of features that may be included in IC design data 520. In IC designs having critical dimensions (the minimum distance between edges of various types of features in various regions in the IC design) near the wavelength of the light source used to manufacture the IC, the proximity of neighboring edges can distort edge placement in the manufactured IC. FIG. 10 illustrates one embodiment of a manufactured IC based on the IC design of FIG. 7 having critical dimensions near or below the wavelength of the light source. Paths 701 to 705 are separated by the minimum allowed spacing of 0.3 microns, so paths 701 to 705 are said to be densely packed. Path 1003, which goes from densely packed to isolated, is thin where it is densely spaced, but thick where it is isolated. Similarly, paths 1001 and 1005, which are densely packed along one edge and isolated along another, are thicker than paths 1002 and 1004.

Isolated path 706 of FIG. 7 may also turn out distorted in the manufactured IC. In FIG. 10, corresponding isolated path 1006 turned out to be thicker and shorter than intended. That is, in addition to a thicker-than-intended line width due to isolated edges, the ends of path 1006 fall short of where the path is intended to end. This is called line-end pull back, and can lead to breaks in connectivity. Path 1006 turned out thicker because, like the top part of path 1003, the edge fragments are isolated.

Features 720 comprise a number contact pads. Exterior edges of the group of contact pads 720 are isolated in that there are no edges close by. Some of the interior edges, however, are densely spaced with several edges in close proximity. As with paths 701 to 706, the proximity of neighboring edges among contact pads 720 can alter the edge intensity gradients, and distort edge placement. In FIG. 10, contact pads 1020 overlap where edges in the IC design are in close proximity with three or more edges of neighboring pads.

Feature 730 is actually two polygons—a five vertex polygon 735 and a four vertex polygon 740. Again, the proximity of edges within feature 730 may distort edge placement, particularly near the corners, and where polygon 735 is particularly close to polygon 740. In FIG. 10, feature 1030 has a break in connectivity where polygon 735 is close to polygon 740.

Rather than applying model-based or rule-based OPC to the entire design, a user could apply one or more tagging scripts to the IC design to selectively identify edge fragments likely to need corrections. FIG. 11 illustrates part of a tagging script that is applicable to some of the features illustrated in FIG. 7. The tagging script uses tag identifiers to narrow the set of tagged edge fragments until only the desired edge fragments are tagged. For instance, with respect to edge placement distortions on path 703, OPC does not need to be performed on all of the edge fragments in the IC design. Instead, OPC can be selectively performed on the vertical edge fragments of path 703 that extend beyond the other paths.

First, in FIG. 11, the IC design is cleared of any previously created tags. Then a new tag, "pathFrag," is created. In the illustrated embodiment, the path width W is 0.25 microns and the minimum spacing between paths 701 to 705 is 0.3 microns. So, it is probably safe to assume that any edge fragments separated by a distance from inside edge to inside edge of 0.25 microns are path edge fragments. Based on this assumption, line 1112 identifies and tags all of the vertical edge fragments in paths 701 to 706.

To tag the rest of the edge fragments in the paths, line 1113 tags all of the edge fragments in any loop containing an edge fragment previously tagged pathFrag. So, all of the edge fragments comprising paths 701 to 706 are tagged "path" in line 1113.

The next step toward focusing in on path 703 is to exclude path 706. Path 706 is isolated. The distance between it and surrounding edge fragments is more than the minimum spacing. So, in line 1114, only edge fragments that were previously tagged "path" and that are separated by a distance from outside edge to outside edge of up to 0.4 microns are tagged "densePathEdge." This step excludes path 706 because it is separated by more than 0.4 microns.

Line 1114 only tagged the densely packed, vertical edge fragments of paths 701 to 706. So, in line 1115, all of the edge fragments comprising paths 701 to 705 are tagged "densepath" by marking every edge fragment in any loop containing edge fragments previously tagged "densePathEdge."

In line 1116, the line-end edge fragments of paths 701 to 705 are excluded so that only the vertical edge fragments remain. These vertical edge fragments are tagged "densePathNoEnds." In line 1117, the densely packed vertical edge fragments of paths 701 to 705 are excluded by tagging only edge fragments previously tagged densePathNoEnds and that are separated by more than 1.0 micron from the nearest edge fragment. In which case, only the outside edges of paths 701 and 705, and the isolated vertical edges of path 703, are tagged "isoFragOnDensePath."

In line 1118, the outside edges of paths 701 and 705 are excluded by only tagging edge fragments previously tagged isoFragOnDensePath and that are separated by more than 1.0 microns from inside to the nearest outside edge. For instance, the edge fragments of path 701 that are tagged isoFragOnDensePath are on the left edge of path 701. Measuring from the inside of the left edge of path 701 means measuring to the right toward path 702. In which case, the nearest outside edge is the left edge of path 702. The distance between the left edge of path 701 and the left edge of path 702 is less than 1.0 microns. The same is true for path 705. So, the only remaining edge fragments, tagged "isoDenseFrag," are the vertical edge fragments of path 703 that extend beyond the other paths.

In lines 1119 and 1120 a model, optimized for isolated-to-dense paths, is selectively applied to the appropriate edge fragments. The model could simulate the IC design and only calculate edge placement errors for the tagged edge fragments. For each tagged edge fragment, if the edge placement error is too large, the model can push or pull the edge fragment until the edge placement error is within acceptable limits.

Alternately, the optimized model could introduce a dummy feature, such as an assist feature, of arbitrary shape, size, and distance from each tagged edge fragment. For instance, in one embodiment, the dummy feature could be a user-defined rectangle, having an arbitrary, user-defined length, width, and distance. Then, model-based OPC could be used to determine an acceptable length, width, and distance for the dummy feature from a respective tagged edge fragment to reduce the edge placement error to acceptable limits.

Figure 12:
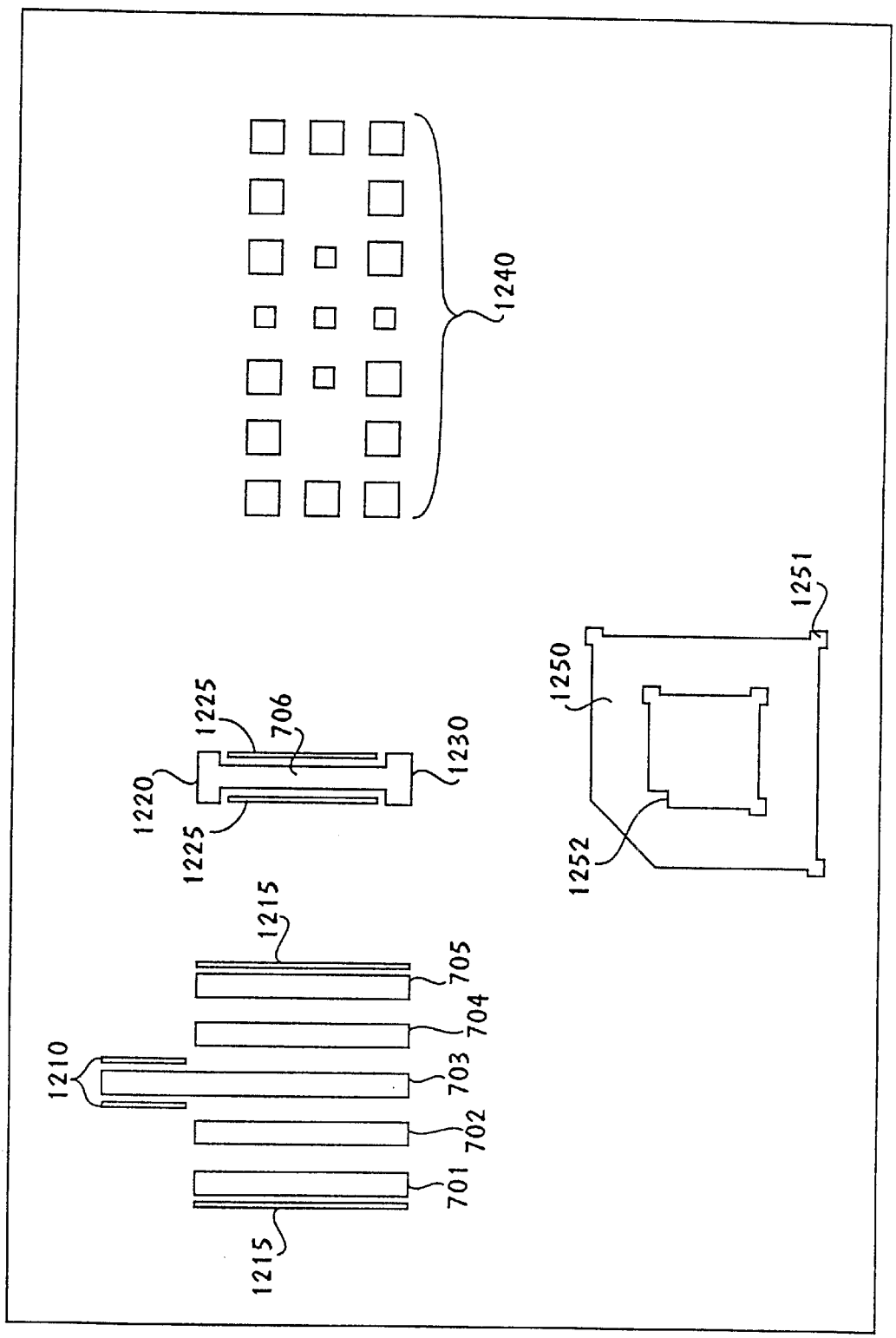
FIG. 12 illustrates one embodiment of compensated features.

For instance, FIG. 12 illustrates one embodiment of assist features 1210. Unlike leveling bars described in U.S. Pat. No. 5,242,770 discussed above, the assist features are not simply positioned a predetermined distance from the path as in a rule-based approach. Instead, model-based OPC is selectively applied to only the necessary edge fragments to position the assist features and determine a width for the assist features based on simulation. The model could be optimized for correcting line-width variations. For instance, instead of first attempting to push or pull the edge fragments, as may be the case in a generalized model-based OPC approach, the optimized model for line-width variations could go directly to assist features. In more complicated IC designs, the distance and width of assist features may vary from one edge fragment to the next depending on neighboring edges.

Returning to FIG. 11, lines 1111 to 1120 of the tagging script demonstrate that nearly any type of edge fragment can be isolated in an IC design. Of course, any number of approaches, many of which may be much more direct, could be taken in a tagging script to isolate the appropriate edge fragments of path 703. Moreover, various alterations in syntax could be used to combine one or more lines of the tagging script.

In lines 1121 to 1124 of the tagging script, edge fragments at the ends of path 706 are isolated and an optimized model is applied to add hammerheads 1220 and 1230, as shown in FIG. 12. For instance, an optimized hammerhead model may take a rule-based approach and simply bias line-end edge fragments out a particular amount. A more accurate model may also calculate an edge placement error to determine if model-based OPC is needed. The hammerheads are intended to compensate for line-end pull back so that the line turns out closer to the intended length.

Similar tagging scripts could also be written to selectively apply OPC to the isolated edges of paths 701, 705, and 706. As shown in FIG. 12, model-based OPC may result in assist features 1215 and 1225. Assist features may also be applicable to edge fragments which are neither isolated nor densely packed. For instance, in more complicated IC designs, features may be close enough to interfere with neighboring edge placements without being densely packed.

Likewise, OPC could be selectively applied to only those edge fragments in contact pads 720 and feature 730 likely to need correction. For instance, densely packed and isolated edge fragments in contact pads 720 could be tagged based on the number of surrounding edge fragments within the critical dimension. For feature 730, corner edge fragments could be tagged. Then, rule-based or model-based OPC, or a mixture of the two, could be applied to the tagged edges. For instance, as shown in FIG. 12, corner edge fragments at corner 1251 in feature 1250 have been pushed out. A predetermined outward bias may be sufficient to correct for the distortion at corner 1251. At corner 1252 however, the edge fragments have been pulled in. A predetermined outward bias would have made the distortion worse, not better, by enlarging the break in connectivity shown in FIG. 10 for feature 1030. In which case, if a rule-based outward bias had first been applied to corner 1252, calculating the edge placement errors for corner edge fragments would have uncover the rule-based failure. Limited application of model-based OPC could then correct the rule-based failure.

Any number of alternate tagging scripts are possible. An alternate tagging script could calculate edge placement errors for all edge fragments in an IC design or region. Then, edge fragments could be tagged if their edge placement errors are outside an allowable tolerance limit. For the tagged edge fragments, just enough OPC could be selectively applied to bring the entire IC design within the tolerance limit.

IC design data may include multiple layers of features. Overlapping features on different layers can also cause edge placement distortions. In which case, a tagging script could identify edge fragments which overlap from layer to layer and apply OPC accordingly.

A tagging script could also be used to identify particularly complex regions, or regions having may edges with unacceptable edge placement errors. These regions may be flagged for a user to perform manual OPC, or automated model-based OPC could be applied to an entire flagged region.

Tagging scripts could also be used to identify manually entered or previously existing corrections or assist features. For instance, hammerheads on the ends of lines could be identified and tagged based on a particular sequence of edge segments and turns. Then, automated OPC could be disabled on tagged hammerhead edge fragments so that corrections are not added on top of corrections. Alternately, previously existing corrections could be tagged and removed so that automated OPC could start with a clean slate.

Another tagging script may store tags as persistent tags. For instance, markers for the coordinates of each edge fragment in a set of edge fragments may be stored in another layer of the IC design data so that the set of tagged edge fragments can be quickly identified by other EDA tools. For instance, as discussed above with respect to FIG. 5, modified IC data 560 may include several layers of persistent tags 570. The persistent tags could be stored with coordinates that overlap the corresponding edge fragments. A separate layer could be used for each type of tag.

Figure 13:
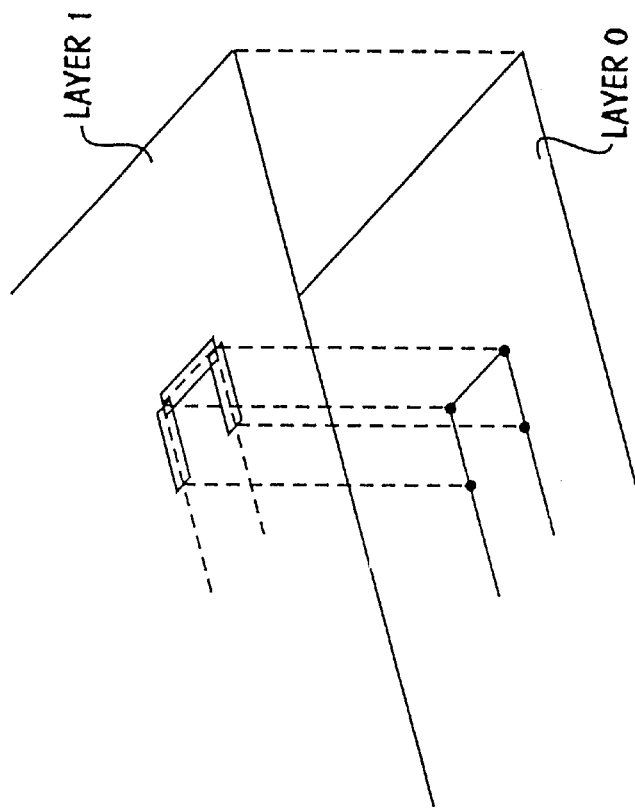
FIG. 13 illustrates one embodiment of persistent tags.

For instance, FIG. 13 illustrates a line-end on layer 0. On layer 1, boxes indicate which edge fragments on layer 0 are tagged as line-end edge fragments. In a visual display of the IC data, a user can superimpose layer 0 and layer 1 so that the tagged edge fragments are marked with boxes.

Figure 14:
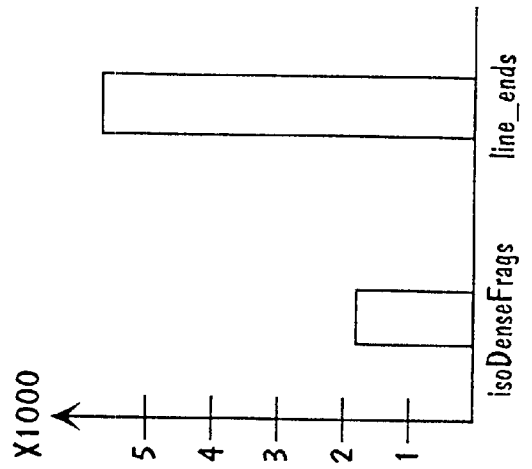
FIG. 14 illustrates one embodiment of a histogram for tags.

In addition to conveniently visualizing tagged edge fragments, storing persistent tags on separate layers also facilitates counting how many edge fragments are tagged with a particular tag. For instance, the number of tags on a layer can be counted automatically and the number displayed in a histogram. FIG. 14 illustrates one embodiment of a histogram for isolated-to-dense edge fragments and line-end edge fragments. The histogram may be used, for instance, to estimate OPC processing time for an IC design as a function of the number of particular types of edge fragments.

Figure 15:
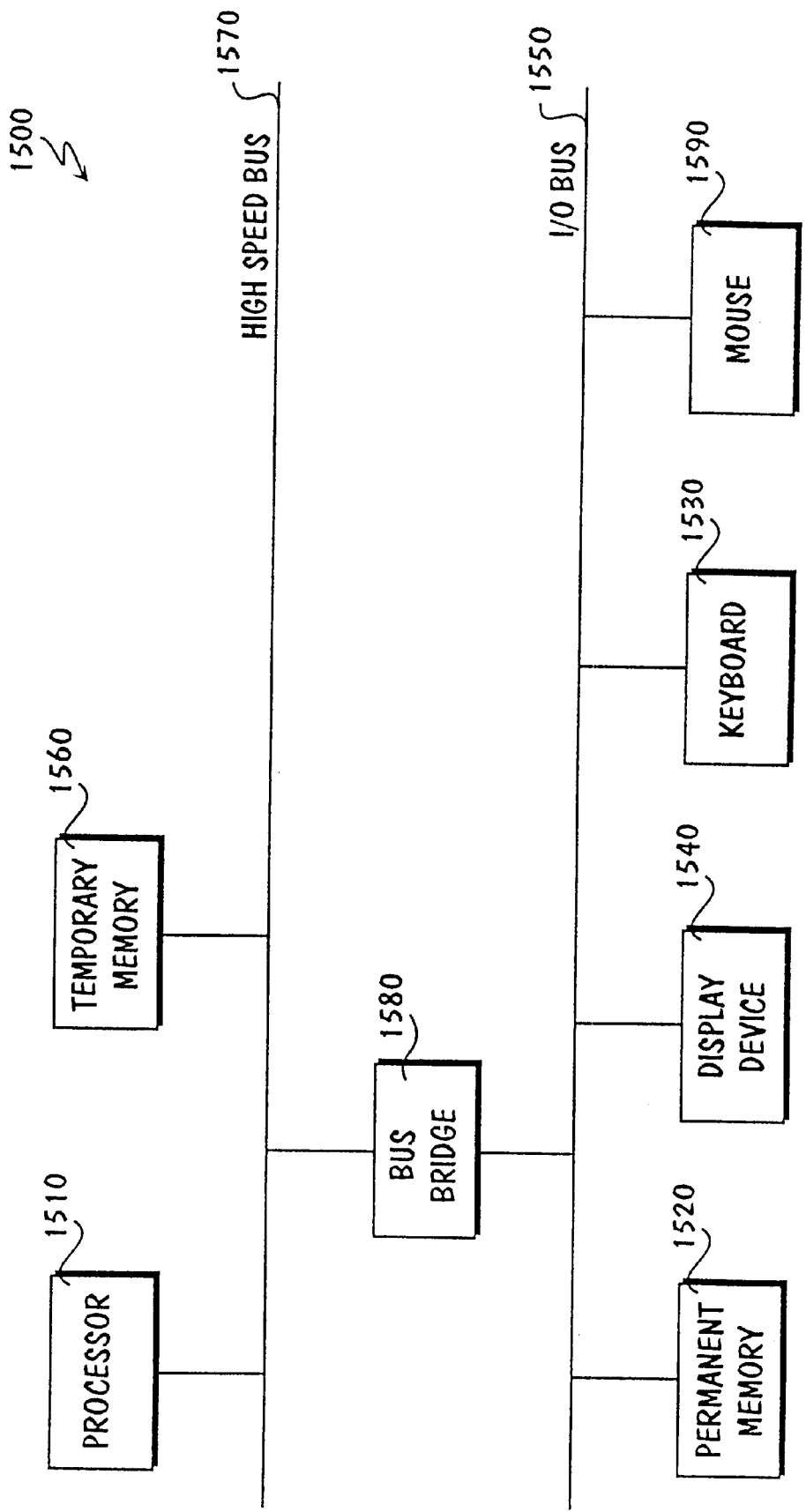
FIG. 15 illustrates one embodiment of a computer system.

FIG. 15 is intended to represent a broad category of computer systems. In FIG. 15, processor 1510 includes one or more microprocessors. Processor 1510 is coupled to temporary memory 1560 by high speed bus 1570. High speed bus 1570 is coupled to Input/Output bus 1550 by bus bridge 1580. Permanent memory 1520 and Input/Output devices, including display device 1540, keyboard 1530, and mouse 1590, are also coupled to Input/Output bus 1550. In certain embodiments, one or more components may be eliminated, combined, and/or rearranged. A number of additional components may also be coupled to either bus 1550 and/or 1570 including, but not limited to, another bus bridge to another bus, one or more disk drives, a network interface, additional audio/video interfaces, additional memory units, additional processor units, etc.

Figure 16:
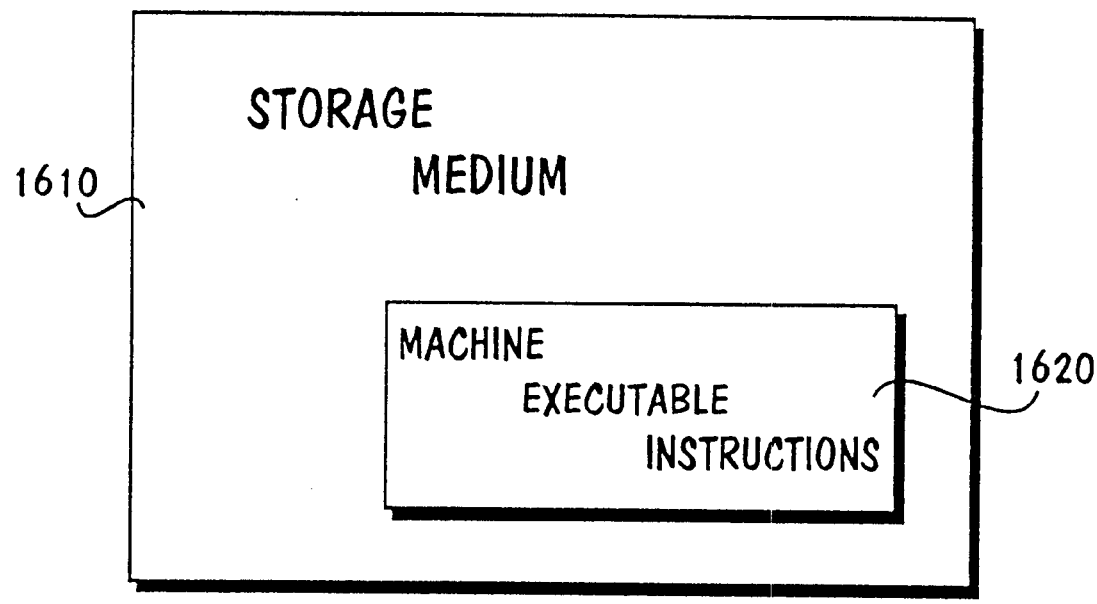
FIG. 16 illustrates one embodiment of a machine readable storage medium.

EDA tool 510, as shown in FIG. 5, can be executed by processor 1510 as a series or sequence of machine readable instructions or function calls stored, for instance, in permanent memory 1520 or temporary memory 1560. Alternately, as shown in FIG. 16, machine executable instructions 1620, representing the function of EDA tool 510, could be stored on distribution storage medium 1610, such as a CD ROM, a digital video or versatile disk (DVD), or a magnetic storage medium like a floppy disk or tape. The instructions could also be downloaded from a local or remote server.

Alternately, the present invention could be implemented in any number of additional hardware machines. For instance, one or more ASICs (application specific integrated circuits) could be endowed with some or all of the functionality of EDA tool 510, and inserted into system 1500 of FIG. 15 as separate components, or combined with one or more other components.

Thus, an improved method and apparatus for designing ICs is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A method comprising:

providing a first tag identifier to an integrated circuit (IC) design, said first tag identifier to define properties for edge fragments in the IC design having edge placement distortion due to a proximity of one or more neighboring features;

tagging a first edge fragment with a first tag if the first edge fragment has the properties defined by the first tag identifier;

introducing an arbitrary assist feature corresponding to each edge fragment having the first tag; and performing model-based optical and process correction (OPC) on each edge fragment having the first tag and on the corresponding arbitrary assist feature.

2. The method of claim 1 further comprising:

homogenizing a plurality of geometric data describing the IC design into sets of vertices defining closed loops.

3. The method of claim 1 further comprising:

fragmenting a plurality of geometric data describing the IC design by adding vertices to the plurality of geometric data according to employment rules.

4. An article of manufacture comprising:

a storage medium, the storage medium having stored thereon a plurality of instructions that, when executed by a machine, result in providing a first tag identifier to an integrated circuit (IC) design, said first tag identifier to define properties for edge fragments in the IC design having edge placement distortion due to a proximity of one or more neighboring features;

tagging a first edge fragment with a first tag if the first edge fragment has the properties defined by the first tag identifier;

introducing an arbitrary assist feature corresponding to each edge fragment having the first tag; and performing model-based optical and process correction (OPC) on each edge fragment having the first tag and on the corresponding arbitrary assist feature.

5. The article of claim 4, wherein the plurality of instructions, when executed by the machine, further result in:

homogenizing a plurality of geometric data describing the IC design into sets of vertices defining closed loops.

6. The article of claim 4 further comprising:

fragmenting a plurality of geometric data describing the IC design by adding vertices to the plurality of geometric data according to employment rules.

7. An apparatus comprising first circuitry to provide a first tag identifier to an integrated circuit (IC) design, said first tag identifier to define properties for edge fragments in the IC design having edge placement distortion due to a proximity of one or more neighboring features;

second circuitry to tag a first edge fragment with a first tag if the first edge fragment has the properties defined by the first tag identifier; and third circuitry to introduce an arbitrary assist feature corresponding to each edge fragment having the first tag; and fourth circuitry to perform model-based optical and process correction (OPC) on each edge fragment having the first tag and on the corresponding arbitrary assist feature.

\* \* \* \* \*